(12) United States Patent  (10) Patent No.: US 9,385,244 B2
Hirakata  (45) Date of Patent: Jul. 5, 2016

(54) WIDE BANDGAP SEMICONDUCTOR DEVICE

(71) Applicant: Sumitomo Electric Industries, Ltd., Osaka (JP)

(72) Inventor: Noriyuki Hirakata, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/617,111

(22) Filed: Feb. 9, 2015

(65) Prior Publication Data

US 2015/0263180 A1  Sep. 17, 2015

(30) Foreign Application Priority Data

Mar. 11, 2014  (JP) .................................. 2014-047806

(51) Int. Cl.
 *H01L 29/15* (2006.01)
 *H01L 29/872* (2006.01)
 *H01L 29/16* (2006.01)
 *H01L 29/36* (2006.01)
 *H01L 29/66* (2006.01)
 *H01L 29/06* (2006.01)

(52) U.S. Cl.
 CPC .......... *H01L 29/872* (2013.01); *H01L 29/0619* (2013.01); *H01L 29/0688* (2013.01); *H01L 29/0692* (2013.01); *H01L 29/1608* (2013.01); *H01L 29/36* (2013.01); *H01L 29/6606* (2013.01)

(58) Field of Classification Search
 USPC .............. 257/77, 54, 73, 155, 260, 267, 281, 257/449, 453, 471, 473, 478, E51.009, 257/E33.051, E31.065, E27.04, E27.068, 257/E29.013, E29.148, E29.338
 See application file for complete search history.

(56) References Cited

U.S. PATENT DOCUMENTS

2009/0302327 A1* 12/2009 Rexer .................. H01L 29/0626
 257/77

FOREIGN PATENT DOCUMENTS

JP  59-035183  8/1984
JP  2009-140963  6/2009

* cited by examiner

*Primary Examiner* — Timor Karimy
(74) *Attorney, Agent, or Firm* — Venable LLP; Michael A. Sartori; Laura G. Remus (57) ABSTRACT

A wide bandgap semiconductor device includes a wide bandgap semiconductor layer and a Schottky electrode. The wide bandgap semiconductor layer includes a first impurity region which is in contact with the Schottky electrode, is in contact with a second main surface, and has a first conductivity type, and a second impurity region which is in contact with the Schottky electrode, is in contact with the first impurity region, and has a second conductivity type. The second impurity region has a first region which is in contact with the Schottky electrode, and a second region which is connected with the first region and provided on a side of the first region closer to the second main surface. A maximum value of a width of the second region is larger than a width of a boundary portion between the first region and the Schottky electrode.

17 Claims, 7 Drawing Sheets

WIDE BANDGAP SEMICONDUCTOR DEVICE

BACKGROUND OF THE INVENTION

1. Field of the Invention

The present invention relates to a wide bandgap semiconductor device, and in particular to a wide bandgap semiconductor device having a Schottky electrode.

2. Description of the Background Art

A Schottky barrier diode is a diode which applies a Schottky barrier formed by a junction between a metal and a semiconductor. The Schottky barrier diode has advantages that it has a small voltage drop in a forward direction, and that it can make a high-speed response. On the other hand, it has been conventionally known that the Schottky barrier diode has problems that it has a large leak current in a reverse direction, and that it has a low reverse-direction breakdown voltage. In order to solve these problems, Schottky barrier diodes having a structure in which a plurality of junction barriers are provided at a Schottky junction interface have been proposed. Such a Schottky barrier diode is called a junction barrier Schottky diode (JBS).

For example, Japanese Patent Publication No. 59-35183 describes a JBS having an n-type region, a p-type region surrounded by the n-type region except for its front surface, and a Schottky barrier metal layer which is in contact with both the n-type region and the p-type region. According to the JBS, the p-type region is arranged to suppress a reverse current which flows through the n-type region, the metal layer, and a pn junction formed by the n-type region and the p-type region when a reverse voltage is applied to the junction, using a space-charge region formed in the n-type region.

Further, Japanese Patent Laying-Open No. 2009-140963 describes a JBS having a semiconductor substrate which has n-type semiconductor layer, a p-type semiconductor layer which constitutes a composite rectification region provided at a predetermined depth from a front surface of the n-type semiconductor layer, and a metal layer which is provided to be in contact with the n-type semiconductor layer and the p-type semiconductor layer. The JBS has a small leak current in the reverse direction, can save power, and can be driven with a low voltage.

SUMMARY OF THE INVENTION

However, according to the JBS described in each of Japanese Patent Publication No. 59-35183 and Japanese Patent Laying-Open No.2009-140963, a high breakdown voltage can be obtained, but electric resistance is also increased.

The present invention has been made in view of the aforementioned problem, and one object of the present invention is to provide a wide bandgap semiconductor device which has a high breakdown voltage and can suppress an increase in electric resistance.

A wide bandgap semiconductor device in accordance with the present invention includes a wide bandgap semiconductor layer and a Schottky electrode. The wide bandgap semiconductor layer has a first main surface and a second main surface opposite to the first main surface. The Schottky electrode is in contact with the first main surface of the wide bandgap semiconductor layer. The wide bandgap semiconductor layer includes a first impurity region which is in contact with the Schottky electrode at the first main surface, is in contact with the second main surface, and has a first conductivity type, and a second impurity region which is in contact with the Schottky electrode at the first main surface, is in contact with the first impurity region, and has a second conductivity type different from the first conductivity type. The second impurity region has a first region which is in contact with the Schottky electrode at the first main surface, and a second region which is connected with the first region and provided on a side of the first region closer to the second main surface. When viewed in a cross sectional view, a maximum value of a width of the second region along a direction parallel to the first main surface is larger than a width of a boundary portion between the first region and the Schottky electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description of Embodiments of the Invention of the Present Application

Hereinafter, embodiments of the present invention will be described with reference to the drawings. It is noted that identical or corresponding parts in the drawings will be designated by the same reference numerals, and the description thereof will not be repeated.

As a result of earnest studies on a method for suppressing an increase in electric resistance while maintaining a high breakdown voltage in a wide bandgap semiconductor device, the inventor has obtained the following findings and found the present invention.

Figure 1:
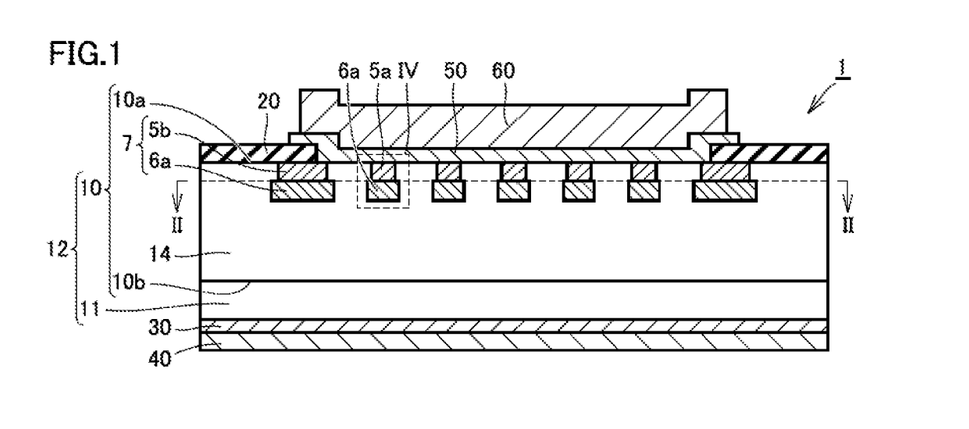
FIG. 1 is a schematic cross sectional view in a region I-I in FIG. 2.

Referring to FIG. 1, a JBS 1 has a first impurity region 14 (n-type region) which is provided to connect both a Schottky electrode 50 (anode electrode) and an ohmic electrode 30 (cathode electrode), and a second impurity region 7 (p-type region) which is in contact with both Schottky electrode 50 and first impurity region 14. In JBS 1, a forward current is less likely to flow through second impurity region 7 which is in contact with Schottky electrode 50. Thus, if the width of a contact portion between Schottky electrode 50 and second impurity region 7 in a direction parallel to a front surface of a substrate is increased, electric resistance is increased. On the other hand, if the width of second impurity region 7 is decreased, the width of a depletion layer extending from second impurity region 7 to first impurity region 14 is decreased, resulting in a larger leak current in a reverse direction and a reduced breakdown voltage of JBS 1.

As a result of the earnest studies, the inventor has found that a JBS having a high breakdown voltage and a low electric resistance can be achieved by dividing second impurity region 7 into a first region 5 which is in contact with Schottky electrode 50 and a second region 6 which is located on a side opposite to Schottky electrode 50 and connected with first region 5, and setting a maximum value of a width of second region 6 to be larger than a width of a boundary portion between Schottky electrode 50 and first region 5.

(1) Wide bandgap semiconductor device 1 in accordance with an embodiment includes a wide bandgap semiconductor layer 10 and Schottky electrode 50. Wide bandgap semiconductor layer 10 has a first main surface 10a and a second main surface 10b opposite to first main surface 10a. Schottky electrode 50 is in contact with first main surface 10a of wide bandgap semiconductor layer 10. Wide bandgap semiconductor layer 10 includes first impurity region 14 which is in contact with Schottky electrode 50 at first main surface 10a, is in contact with second main surface 10b, and has a first conductivity type, and second impurity region 7 which is in contact with the Schottky electrode at first main surface 10a, is in contact with first impurity region 14, and has a second conductivity type different from the first conductivity type. Second impurity region 7 has first region 5 which is in contact with Schottky electrode 50 at first main surface 10a, and second region 6 which is connected with first region 5 and provided on a side of first region 5 closer to second main surface 10b. When viewed in a cross sectional view, a maximum value W2, W3, W4 of the width of second region 6 along a direction parallel to first main surface 10a is larger than a width W1 of a boundary portion 5a1 between first region 5 and Schottky electrode 50.

According to wide bandgap semiconductor device 1 in accordance with (1) described above, when viewed in a cross sectional view, maximum value W2, W3, W4 of the width of second region 6 along the direction parallel to first main surface 10a is larger than width W1 of boundary portion 5a1 between first region 5 and Schottky electrode 50. Thereby, wide bandgap semiconductor device 1 having a high breakdown voltage and a low electric resistance can be obtained. Further, increases in rising voltage and forward voltage drop can be suppressed.

(2) Preferably, in wide bandgap semiconductor device 1 in accordance with (1) described above, second region 6 has a first surface portion 6a1 which faces first main surface 10a, and a second surface portion 6a2 which is opposite to first surface portion 6a1 and faces second main surface 10b. First region 5 is provided to extend from a portion of first surface portion 6a1 of second region 6 to first main surface 10a. Thereby, narrowing of a current path can be suppressed when compared with a case where first region 5 is provided to extend from entire first surface portion 6a1 of second region 6 to first main surface 10a.

(3) Preferably, in wide bandgap semiconductor device 1 in accordance with (2) described above, when viewed in a plan view, an area of boundary portion 5a1 is smaller than an area of second surface portion 6a2 of second region 6. Thereby, wide bandgap semiconductor device 1 having a high breakdown voltage and a low electric resistance can be obtained effectively.

(4) Preferably, in wide bandgap semiconductor device 1 in accordance with any of (1) to (3) described above, an impurity concentration of first region 5 is higher than an impurity concentration of second region 6. Thereby, contact resistance between first region 5 and Schottky electrode 50 can be reduced.

(5) Preferably, in wide bandgap semiconductor device 1 in accordance with any of (1) to (4) described above, when viewed in a plan view, first region 5 has an island shape. Thereby, a contact area between first region 5 and Schottky electrode 50 can be reduced effectively.

(6) Preferably, in wide bandgap semiconductor device 1 in accordance with any of (1) to (5) described above, when viewed in a plan view, second region 6 has a stripe shape. Thereby, a space-charge region can be formed effectively, and a leak current can be reduced.

(7) Preferably, in wide bandgap semiconductor device 1 in accordance with any of (1) to (6) described above, first region 5 has a plurality of first region portions 5a, and, when viewed in a plan view, the plurality of first region portions 5a are provided along both a first direction x parallel to first main surface 10a and a second direction y parallel to first main surface 10a and perpendicular to first direction x. Thereby, the contact area between first region 5 and Schottky electrode 50 can be reduced more effectively.

(8) Preferably, in wide bandgap semiconductor device 1 in accordance with any of (1) to (7) described above, the wide bandgap semiconductor layer includes silicon carbide. Thereby, the breakdown voltage of the semiconductor device can be improved more effectively.

(9) Preferably, in wide bandgap semiconductor device 1 in accordance with any of (1) to (8) described above, second region 6 includes a plurality of second region portions 6a, and wide bandgap semiconductor layer 10 further includes a third impurity region 8 which is provided between the plurality of second region portions 6a, has the first conductivity type, and has an impurity concentration higher than an impurity concentration of first impurity region 14. Thereby, third impurity region 8 can restrict the depletion layer extending from second impurity region 7 to first impurity region 14, and suppress an increase in electric resistance.

(10) Preferably, in wide bandgap semiconductor device 1 in accordance with (9) described above, third impurity region 8 is spaced from each of the plurality of second region portions 6a. Thereby, generation of a strong electric field at a boundary between first impurity region 14 and second impurity region 7 can be suppressed, and thus breakdown voltage can be further improved.

Details of Embodiments of the Invention of the Present Application (Embodiment 1)

First, a structure of a JBS as a wide bandgap semiconductor device in accordance with Embodiment 1 of the present invention will be described with reference to FIGS. 1 to 10.

Referring to FIG. 1, JBS 1 in the present embodiment mainly has a wide bandgap semiconductor substrate 12, Schottky electrode 50, an insulating layer 20, ohmic electrode 30, an upper wire 60 and a lower wire 40. Wide bandgap semiconductor substrate 12 includes a wide bandgap semiconductor single-crystal substrate 11, and wide bandgap semiconductor layer 10 provided on wide bandgap semiconductor single-crystal substrate 11. Each of wide bandgap semiconductor single-crystal substrate 11 and wide bandgap semiconductor layer 10 is made of, for example, silicon carbide, and is preferably made of hexagonal silicon carbide having a polytype of 4H.

Each of wide bandgap semiconductor single-crystal substrate 11 and wide bandgap semiconductor layer 10 contains an impurity such as nitrogen, for example, and has n type (the first conductivity type). Preferably, wide bandgap semiconductor single-crystal substrate 11 has an impurity concentration higher than that of wide bandgap semiconductor layer 10. Wide bandgap semiconductor layer 10 is an epitaxial layer including a wide bandgap semiconductor. A wide bandgap semiconductor is a semiconductor material having a bandgap larger than that of silicon, and includes, for example, silicon carbide, gallium nitride, diamond, or the like. Wide bandgap semiconductor layer 10 has first main surface 10a and second main surface 10b opposite to first main surface 10a.

Wide bandgap semiconductor layer 10 has n-type drift region 14 (first impurity region 14) and the p-type region (second impurity region 7). N-type drift region 14 is in contact with both first main surface 10a and second main surface 10b of wide bandgap semiconductor layer 10, and is connected to ohmic electrode 30 described later with single-crystal substrate 11 interposed therebetween. N-type drift region 14 contains an impurity such as nitrogen, for example, and has n type (the first conductivity type). N-type drift region 14 has an impurity concentration of, for example, more than or equal to $1 \times 10^{14}$ cm$^{-3}$ and less than or equal to $1 \times 10^{16}$ cm$^{-3}$. P-type region 7 is in contact with both first main surface 10a of wide bandgap semiconductor layer 10 and n-type drift region 14. P-type region 7 contains an impurity such as aluminum or boron, for example, and has p type (the second conductivity type) different from n type (the first conductivity type). When p-type region 7 is viewed in a cross sectional view (a view seen along the direction parallel to first main surface 10a of wide bandgap semiconductor layer 10), both the side surface and the bottom surface of p-type region 7 are in contact with n-type drift region 14.

P-type region 7 has first region 5 which is in contact with Schottky electrode 50 at first main surface 10a of wide bandgap semiconductor layer 10, and second region 6 which is connected with first region 5 and provided on the side of first region 5 closer to second main surface 10b. Preferably, the impurity concentration of first region 5 is higher than the impurity concentration of second region 6. The impurity such as aluminum or boron contained in first region 5 has a concentration of, for example, more than or equal to $1 \times 10^{16}$ cm$^{-3}$ and less than or equal to $1 \times 10^{21}$ cm$^{-3}$. Further, the impurity such as aluminum or boron contained in second region 6 has a concentration of, for example, more than or equal to $1 \times 10^{15}$ cm$^{-3}$ and less than or equal to $1 \times 10^{19}$ cm$^{-3}$.

Figure 2:
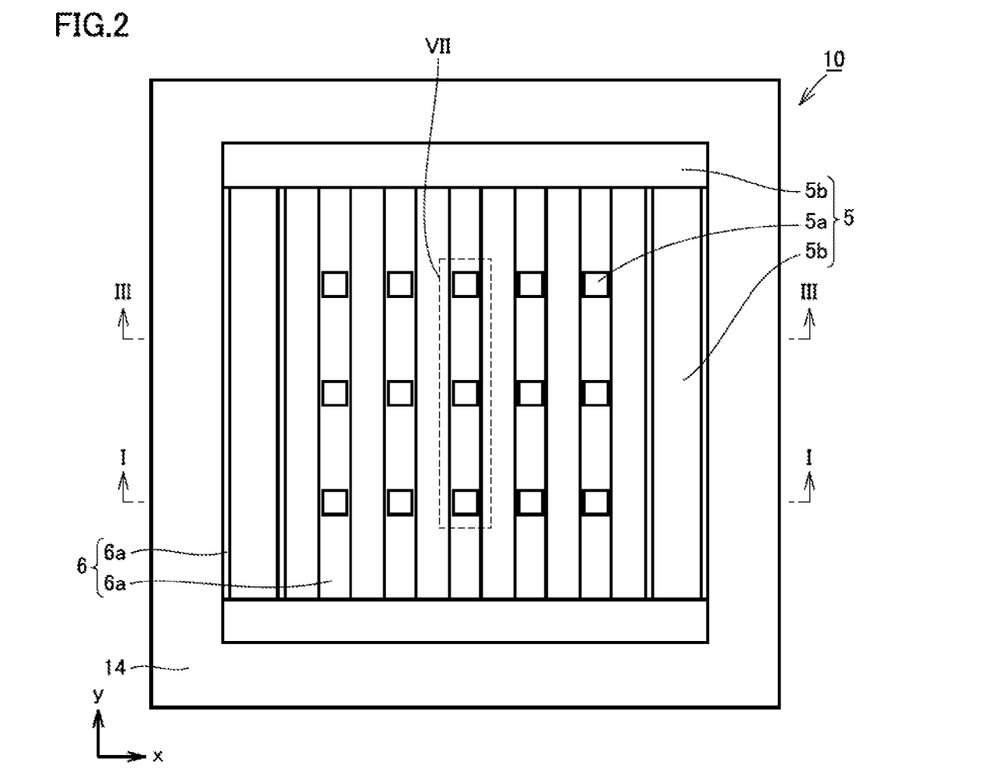
FIG. 2 is a schematic plan view schematically showing a structure of a wide bandgap semiconductor device in accordance with Embodiment 1 of the present invention.

Referring to FIG. 2, when viewed in a plan view (a view along a direction of a normal to first main surface 10a of wide bandgap semiconductor layer 10), first region 5 has an island shape. First region 5 may be a single region, or may have a plurality of first region portions 5a, 5b. In the present embodiment, an island shape refers to a shape formed such that, when viewed in a plan view, the entire outer periphery of first region 5 is surrounded by n-type drift region 14. The width of first region portion 5a along first direction x is substantially identical to the width of first region portion 5a along second direction y. The plurality of first region portions 5a, 5b may be spaced from each other by n-type drift region 14. Preferably, when viewed in a plan view, the plurality of first region portions 5a are provided along both first direction x parallel to first main surface 10a of wide bandgap semiconductor layer 10 and second direction y parallel to first main surface 10a and perpendicular to first direction x.

In the present embodiment, second region 6 has a plurality of second region portions 6a. The plurality of second region portions 6a are arranged substantially in parallel along second direction y. Each of the plurality of second region portions 6a has a stripe shape. In the present embodiment, a stripe shape refers to a band-like shape. Preferably, the stripe shape has a long axis direction and a short axis direction perpendicular to the long axis direction, and the width along the long axis direction is larger than the width along the short axis direction by three times or more. First region 5 may have first region portions 5a arranged along the long axis direction of second region 6 (second direction y), and first region portions 5b extending in the short axis direction of second region 6 (first direction x). First region portions 5b are provided to surround the plurality of first region portions 5a, when viewed in a plan view. First region portion 5b may be arranged to traverse the plurality of second region portions 6a, when viewed in a plan view. First region portion 5b may be in contact with second region 6, or may be spaced from second region 6.

Figure 3:
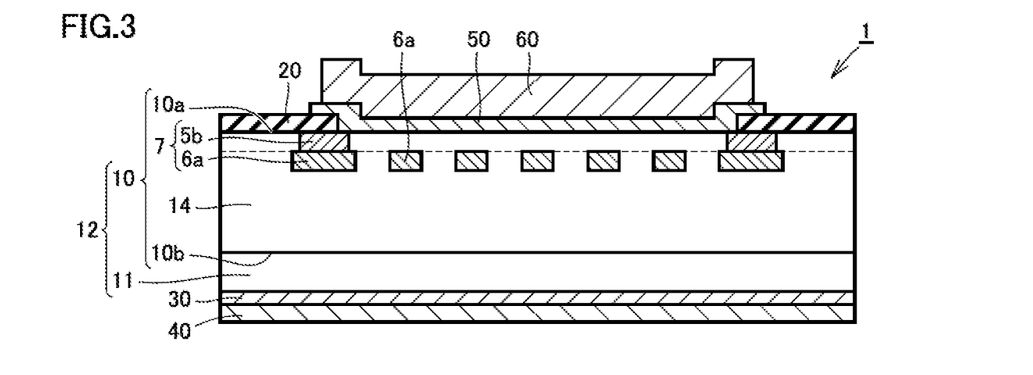
FIG. 3 is a schematic cross sectional view in a region I-I in FIG. 2.

Referring to FIG. 3, when wide bandgap semiconductor layer 10 is viewed in a cross section in a region III-III in FIG. 2, some second region portions 6a are provided to be spaced from each of Schottky electrode 50 and insulating layer 20. That is, n-type drill region 14 is provided between second region portion 6a and first main surface 10a of wide bandgap semiconductor layer 10. Directly below a boundary portion between insulating layer 20 and Schottky electrode 50, first region portion 5b which is in contact with both insulating layer 20 and Schottky electrode 50, and second region portion 6a which is in contact with first region portion 5b are arranged.

Figure 4:
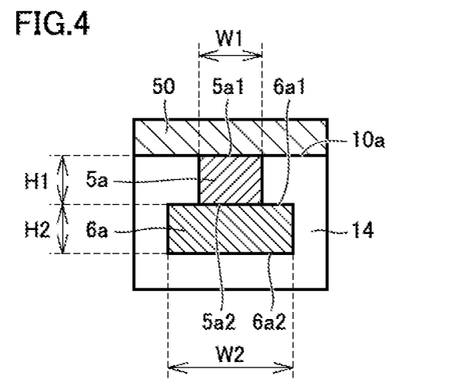
FIG. 4 is an enlarged view of a region IV in FIG. 1.

Referring to FIG. 4, second region 6 has first surface portion 6a1 which faces first main surface 10a of wide bandgap semiconductor layer 10, and second surface portion 6a2 which is opposite to first surface portion 6a1 and faces second main surface 10b of wide bandgap semiconductor layer 10. Preferably, first region 5 is provided to extend from a portion of first surface portion 6a1 of second region 6 to first main surface 10a. More preferably, when viewed in a cross sectional view, first region 5 is provided to extend only from near the center of first surface portion 6a1 of second region 6 to first main surface 10a, and is not in contact with end portions of first surface portion 6a1.

Referring to FIG. 4, preferably, width W1 of boundary portion 5a1 between first region portion 5a and Schottky electrode 50 is smaller than width W2 of first surface portion 6a1 of second region portion 6a. Width W1 of boundary portion 5a1 between first region portion 5a and Schottky electrode 50 is, for example, more than or equal to 1 μm and less than or equal to 2 μm. Width W2 of first surface portion 6a1 of second region portion 6a is, for example, more than or equal to 1 μm and less than or equal to 4 μm. A height H1 of first region portion 5a is, for example, more than or equal to 0.5 μm and less than or equal to 2 μm. A height H2 of second region portion 6a is, for example, more than or equal to 0.2 μm and less than or equal to 1 μm.

Figure 5:
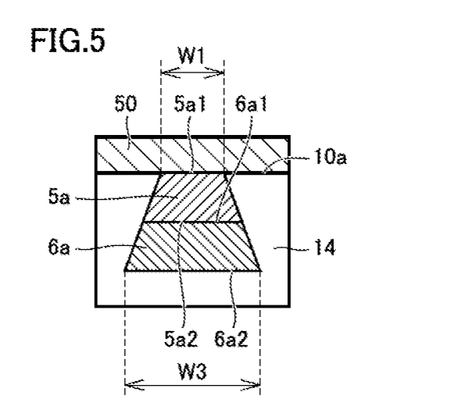
FIG. 5 is a view showing a first variation of FIG. 4.
Figure 6:
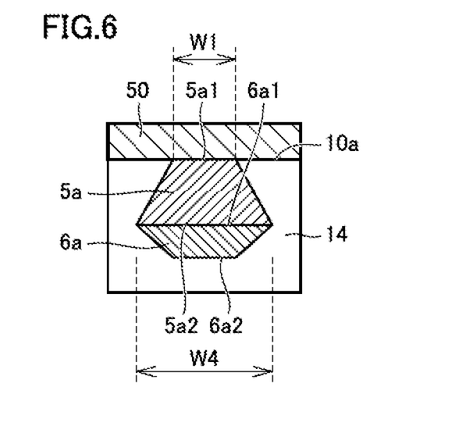
FIG. 6 is a view showing a second variation of FIG. 4.

Referring to FIGS. 5 and 6, first region portion 5a may be provided to extend from entire first surface portion 6a1 of second region portion 6a to first main surface 10a. In this case, the width of a bottom portion of first region portion 5a is equal to the width of first surface portion 6a1 second region portion 6a. As shown in FIG. 5, when viewed in a cross sectional view, each of first region portion 5a and second region portion 6a may have a trapezoid shape. As shown in FIG. 6, when viewed in a cross sectional view, first region portion 5a may have a trapezoid shape, and second region portion 6a may have an inverted trapezoid shape. Preferably, the position of first surface portion 6a1 of second region portion 6a in the direction of the normal to first main surface 10a of wide bandgap semiconductor layer 10 is located closer to second surface portion 6a2 than to first main surface 10a. In any of the cases described above, when viewed in a cross sectional view, maximum value W2, W3, W4 of the width of second region 6 along the direction parallel to first main surface 10a of wide bandgap semiconductor layer 10 is larger than width W of boundary portion 5a1 between first region portion 5a and Schottky electrode 50.

Figure 7:
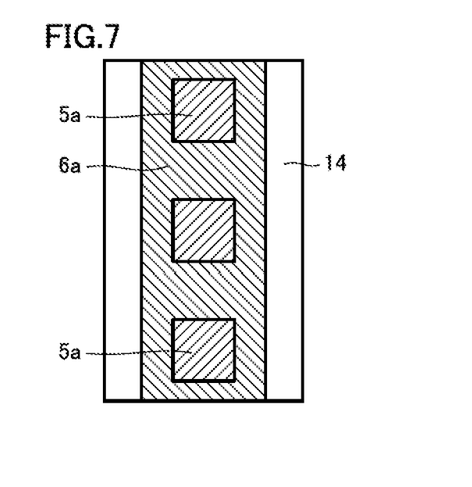
FIG. 7 is an enlarged view of a region VII in FIG. 2.
Figure 8:
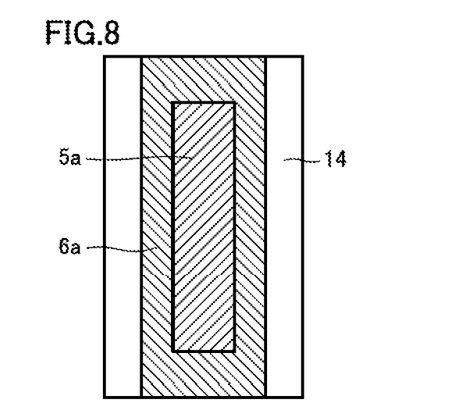
FIG. 8 is a view showing a first variation of FIG. 7.

Referring to FIGS. 7 and 8, when viewed in a plan view, an area first region portion 5a is preferably smaller than an area of second region portion 6a. In other words, the area of boundary portion 5a1 is preferably smaller than the area of second surface portion 6a2 of second region 6. Preferably, when viewed in a plan view, first region portion 5a is arranged such that entire first region portion 5a overlaps with second region portion 6a. As shown in FIG. 7, first region portion 5a may have an island shape, and second region portion 6a may have a stripe shape. As shown in FIG. 8, each of first region portion 5a and second region portion 6a may have a stripe shape.

Figure 9:
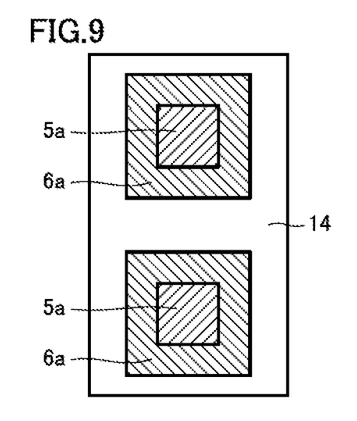
FIG. 9 is a view showing a second variation of FIG. 7.

Referring to FIG. 9, when viewed in a plan view, the plurality of second region portions 6a may be provided to be spaced from each other. One first region portion 5a may be provided on one second region portion 6a. Each of second region portion 6a and first region portion 5a may have a square shape.

Figure 10:
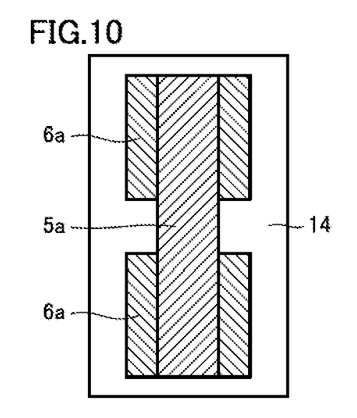
FIG. 10 is a view showing a third variation of FIG. 7.

Referring to FIG. 10, when viewed in a plan view, the plurality of second region portions 6a may also be provided to be spaced from each other, and first region portion 5a may be provided to connect the plurality of second region portions 6a. In this case, when viewed in a plan view, first region portion 5a has a region which overlaps with second region portion 6a, and a region which does not overlap with second region portion 6a. The region which does not overlap with second region portion 6a overlaps with n-type drift region 14.

Referring to FIGS. 1 and 3 again, Schottky electrode 50 is provided in contact with first main surface 10a of wide bandgap semiconductor layer 10. Both first region portion 5a of p-type region 7 and n-type drift region 14 are in contact with Schottky electrode 50 at first main surface 10a. Schottky electrode 50 forms a Schottky junction with n-type drift region 14. Schottky electrode 50 may form an ohmic junction with first region portion 5a. Schottky electrode 50 is made of, for example, titanium (Ti). Other than titanium, for example, Nickel (Ni), titanium nitride (TiN), gold (Au), molybdenum (Mo), tungsten (W), or the like may be used for Schottky electrode 50. That is, Schottky electrode 50 may contain at least one element selected from the group consisting of titanium, molybdenum, nickel, gold, and tungsten.

Insulating layer 20 is in contact with first main surface 10a of wide bandgap semiconductor layer 10. Insulating layer 20 may be in contact with n-type drift region 14 and p-type region 7 at first main surface 10a. Insulating layer 20 is made of, for example, a material containing silicon dioxide. Insulating layer 20 may be made of a material containing silicon nitride or alumina. Schottky electrode 50 is formed to be in contact with a side surface of insulating layer 20 and extend from first main surface 10a onto a front surface of insulating layer 20.

Referring to FIGS. 1 and 3, upper wire 60 is formed in contact with Schottky electrode 50. Upper wire 60 is made of, for example, a material containing aluminum. Upper wire 60 has a thickness of for example, about 5 μm. Ohmic electrode 30 is arranged in contact with single-crystal substrate 11. Ohmic electrode 30 is arranged on a side close to second main surface 10b of wide bandgap semiconductor layer 10. Ohmic electrode 30 is made of, for example, a material containing nickel. Lower wire 40 is provided in contact with ohmic electrode 30. The lower wire is made of, for example, a material containing titanium, nickel, silver or gold, or an alloy thereof. Schottky electrode 50 serves as an anode electrode, and ohmic electrode 30 serves as a cathode electrode.

Next, a method for manufacturing JBS 1 as the wide bandgap semiconductor device in accordance with Embodiment 1 of the present invention will be described with reference to FIGS. 11 to 14.

Figure 11:
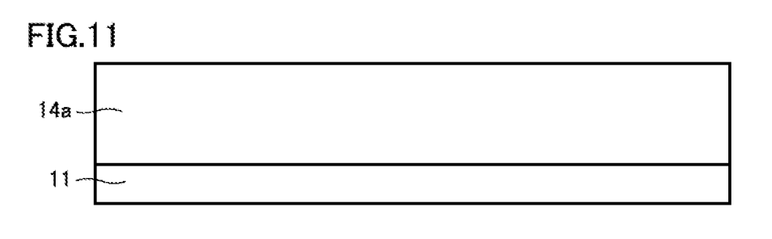
FIG. 11 is a schematic cross sectional view schematically showing a first step of a method for manufacturing the wide bandgap semiconductor device in accordance with Embodiment 1 of the present invention.

Referring to FIG. 11, first, an epitaxial substrate preparation step is performed. Specifically, single-crystal substrate 11 having n-type conductivity type is prepared for example by slicing an ingot (not shown) made of hexagonal silicon carbide having a polytype of 4H. Single-crystal substrate 11 contains an impurity such as nitrogen (N), for example. The impurity contained in single-crystal substrate 11 has a concentration of, for example, about $5 \times 10^{18}$ cm$^{-3}$. Next, a first n-type region 14a is formed on single-crystal substrate 11 by epitaxial growth. First n-type region 14a contains an impurity such as nitrogen, for example, and has n type. First n-type region 14a has an impurity concentration lower than the impurity concentration of single-crystal substrate 11.

Figure 12:
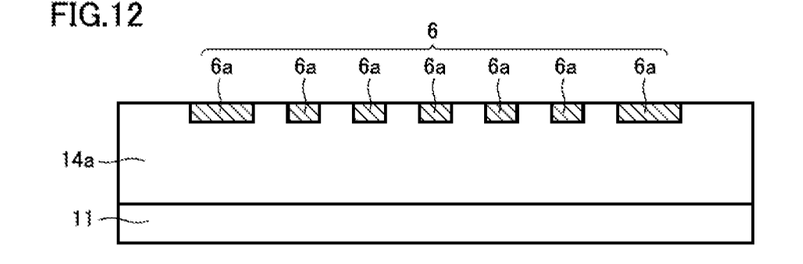
FIG. 12 is a schematic cross sectional view schematically showing a second step of the method for manufacturing the wide bandgap semiconductor device in accordance with Embodiment 1 of the present invention.

Next, an ion implantation step is performed. Referring to FIG. 12, second region 6 having p type is formed for example by implanting Al (aluminum) ions into first n-type region 14a. Second region 6 includes the plurality of second region portions 6a provided to be spaced from each other. Each of the plurality of second region portions 6a is formed to exposed from first n-type region 14a to a front surface of first n-type region 14a.

Figure 13:
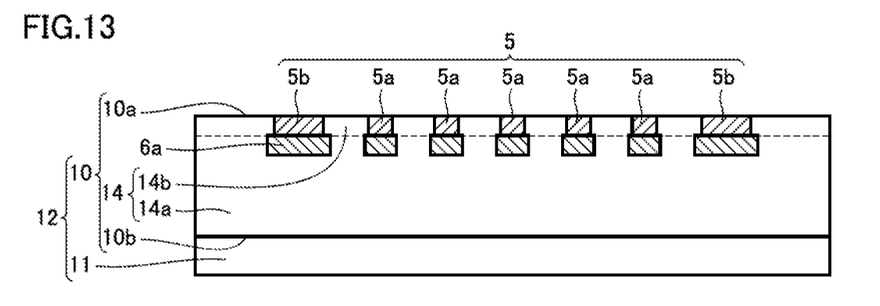
FIG. 13 is a schematic cross sectional view schematically showing a third step of the method for manufacturing the wide bandgap semiconductor device in accordance with Embodiment 1 of the present invention.

Next, a second n-type region 14b is formed on first n-type region 14a. Referring to FIG. 13, second n-type region 14b is formed by epitaxial growth, as with first n-type region 14a. First n-type region 14a and second n-type region 14b constitute n-type drift region 14. First region 5 having p type is formed for example by implanting aluminum ions into a front surface of second n-type region 14b (first main surface 10a). First region 5 is formed to be connected with second region 6. Preferably, the concentration of the impurity contained in first region 5 is higher than the concentration of the impurity contained in second region 6. First region 5 and the second region may be formed by ion implantation, or may be formed by epitaxial growth.

Next, an activation annealing step is performed. Specifically, the impurity which has been introduced in the above ion implantation step is activated for example by heating wide bandgap semiconductor layer 10 at a temperature of about 1800° C. in an atmosphere of an inert gas such as argon. Thereby, a desired carrier is generated in the regions into which the impurity has been introduced.

Next, an insulating layer formation step is performed. Insulating layer 20 made of, for example, silicon dioxide is formed in contact with first main surface 10a of wide bandgap semiconductor layer 10. Insulating layer 20 may be formed for example by CVD (Chemical Vapor Deposition). Next, an opening is formed in insulating layer 20 for example by a photolithography method, such that the central portion of first main surface 10a of wide bandgap semiconductor layer 10 is exposed from insulating layer 20.

Figure 14:
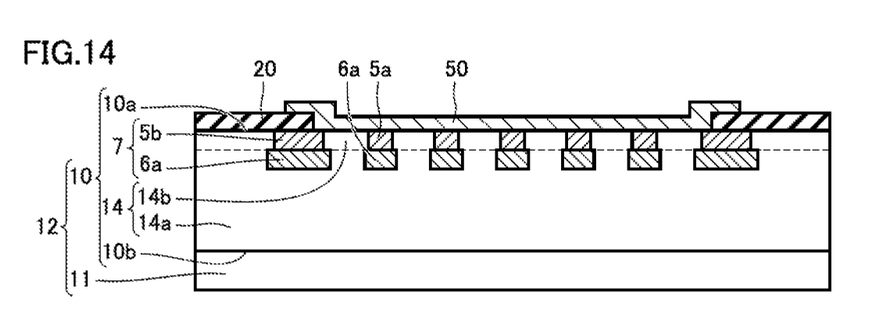
FIG. 14 is a schematic cross sectional view schematically showing a fourth step of the method for manufacturing the wide bandgap semiconductor device in accordance with Embodiment 1 of the present invention.

Next, a Schottky electrode formation step is performed. Referring to FIG. 14, Schottky electrode 50 containing for example titanium (Ti), nickel (Ni), molybdenum (Mo), tungsten (W), or the like is formed within the opening formed in insulating layer 20 provided on first main surface 10a of wide bandgap semiconductor layer 10. Thereby, Schottky electrode 50 which is in contact with both n-type drift region 14 and first region portion 5a of p-type region 7 at first main surface 10a is formed.

Next, an annealing step is performed. Wide bandgap semiconductor layer 10 having insulating layer 20 and Schottky electrode 50 formed on first main surface 10a is subjected to annealing at a temperature of for example, about 500° C. The annealing temperature is preferably more than or equal to about 400° C. and less than or equal to about 700° C., and is more preferably more than or equal to about 350° C. and less than or equal to about 500° C. By annealing wide bandgap semiconductor layer 10 having insulating layer 20 and Schottky electrode 50 formed thereon, Schottky electrode 50 and n-type drift region 14 form a Schottky junction therebetween.

Next, an upper wire formation step is performed. For example, upper wire 60 made of a material containing aluminum is formed on Schottky electrode 50. Next, a back surface grinding step is performed. For example, the thickness of wide bandgap semiconductor layer 10 is reduced by grinding second main surface 10b of wide bandgap semiconductor layer 10. Next, an ohmic electrode formation step is performed. Ohmic electrode 30 made of, for example, a material containing nickel is formed to contact second main surface 10b of wide bandgap semiconductor layer 10. Next, ohmic electrode 30 is heated to about 1000° C. by emitting laser beams to ohmic electrode 30. Thereby, ohmic electrode 30 which forms an ohmic junction with wide bandgap semiconductor layer 10 is formed. Next, a lower wire formation step is performed. Lower wire 40 containing for example titanium, nickel, silver, gold, or the like is formed in contact with ohmic electrode 30. Thereby, JBS 1 shown in FIG. 1 is completed.

Next, the function and effect of JBS 1 in accordance with Embodiment 1 will be described.

According to JBS 1 in accordance with Embodiment 1, when viewed in a cross sectional view, maximum value W2, W3, W4 of the width of second region 6 along the direction parallel to first main surface 10a is larger than width W1 of boundary portion 5a1 between first region 5 and Schottky electrode 50. Thereby, JBS 1 having a high breakdown voltage and a low electric resistance can be obtained. Further, increases in rising voltage and forward voltage drop can be suppressed.

Further, according to JBS 1 in accordance with Embodiment 1, second region 6 has first surface portion 6a1 which faces first main surface 10a, and second surface portion 6a2 which is opposite to first surface portion 6a1 and faces second main surface 10b. First region 5 is provided to extend from a portion of first surface portion 6a1 of second region 6 to first main surface 10a. Thereby, narrowing of a current path can be suppressed, when compared with the case where first region 5 is provided to extend from entire first surface portion 6a1 of second region 6 to first main surface 10a.

Further, according to JBS 1 in accordance with Embodiment 1, when viewed in a plan view, the area of boundary portion 5a1 is smaller than the area of second surface portion 6a2 of second region 6. Thereby, JBS 1 having a high breakdown voltage and a low electric resistance can be obtained effectively.

Further, according to JBS 1 in accordance with Embodiment 1, the impurity concentration of first region 5 is higher than the impurity concentration of second region 6. Thereby, contact resistance between first region 5 and Schottky electrode 50 can be reduced.

Further, according to JBS 1 in accordance with Embodiment 1, when viewed in a plan view, first region 5 has an island shape. Thereby, the contact area between first region 5 and Schottky electrode 50 can be reduced effectively.

Further, according to JBS 1 in accordance with Embodiment 1, when viewed in a plan view, second region 6 has a stripe shape. Thereby, a space-charge region can be formed effectively, and a leak current can be reduced.

Further, according to JBS 1 in accordance with Embodiment 1, first region 5 has the plurality of first region portions 5a, and, when viewed in a plan view, the plurality of first region portions 5a are provided along both first direction x parallel to first main surface 10a and second direction y parallel to first main surface 10a and perpendicular to first direction x. Thereby, the contact area between first region 5 and Schottky electrode 50 can be reduced more effectively.

Further, according to JBS 1 in accordance with Embodiment 1, the wide bandgap semiconductor layer includes silicon carbide. Thereby, the breakdown voltage of JBS 1 can be improved more effectively.

(Second Embodiment)

Next, a structure of a JBS as a wide bandgap semiconductor device in accordance with Embodiment 2 of the present invention will be described with reference to FIGS. 15 and 16.

JBS 1 in accordance with Embodiment 2 is different from JBS 1 in accordance with Embodiment 1 in that wide bandgap semiconductor layer 10 has third impurity region 8, and other than that, it has a configuration identical to that of JBS 1 in accordance with Embodiment 1. Identical or corresponding parts in the drawings will be designated by the same reference numerals, and the description thereof will not be repeated.

Figure 15:
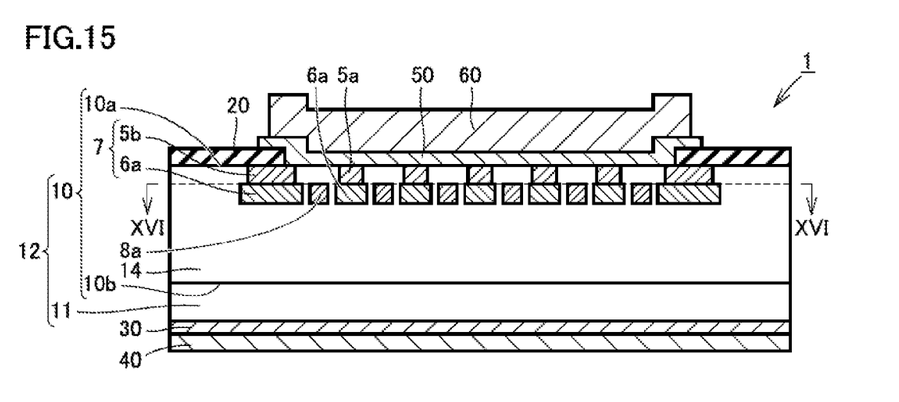
FIG. 15 is a schematic cross sectional view in a region XV-XV in FIG. 16.
Figure 16:
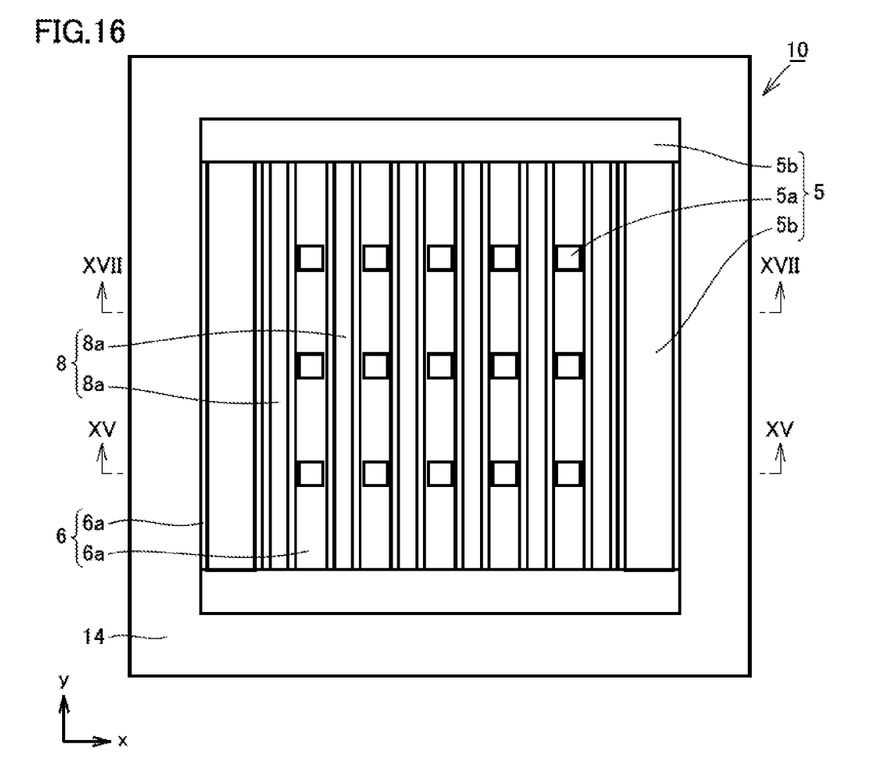
FIG. 16 is a schematic plan view schematically showing a structure of a wide bandgap semiconductor device in accordance with Embodiment 2 of the present invention.
Figure 17:
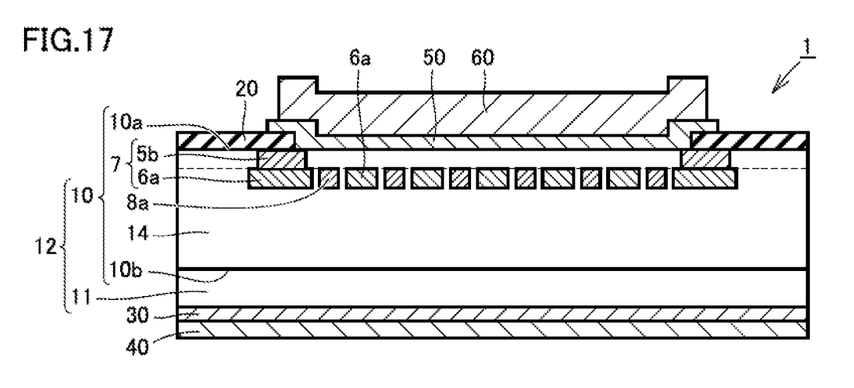
FIG. 17 is a schematic cross sectional view in a region XVII-XVII in FIG. 16.

Referring to FIGS. 15 to 17, wide bandgap semiconductor layer 10 includes n-type region 8 (third impurity region 8) which is provided between the plurality of second region portions 6a. N-type region 8 contains an impurity such as nitrogen, for example, and has n type (the first conductivity type). N-type region 8 has an impurity concentration higher than the impurity concentration of n-type drift region 14. The impurity concentration of n-type region 8 is, for example, more than or equal to $3 \times 10^{14}$ cm$^{-3}$ and less than or equal to $1 \times 10^{17}$ cm$^{-3}$. N-type region 8 includes a plurality of n-type region portions 8a. The plurality an-type region portions 8a are provided to be spaced from each other. Preferably, n-type region portion 8a is provided to be spaced from each of the plurality of second region portions 6a. In this case, n-type region portion 8a is separated from second region portion 6a by n-type drift region 14.

Referring to FIG. 16, each of n-type region portions 8a is provided to be arranged between adjacent second region portions 6a and extend in the same direction as the direction in which second region portion 6a extends. In other words, each of the plurality of n-type region portions 8a is provided to extend along the long axis direction of second region portion 6a (second direction y). Preferably, each of the plurality of n-type region portions 8a has a stripe shape. When viewed in a plan view, n-type region portion 8a may be formed adjacent to a region of second region portion 6a which is not in contact with first region portion 5a, and may be formed adjacent to a region of second region portion 6a which is in contact with first region portion 5a.

Next, the function and effect of JBS 1 in accordance with Embodiment 2 will be described.

According to JBS 1 in accordance with Embodiment 2, second region 6 includes the plurality of second region portions 6a, and wide bandgap semiconductor layer 10 further includes n-type region 8 which is provided between the plurality of second region portions 6a, has the first conductivity type, and has the impurity concentration higher than the impurity concentration of n-type drift region 14. Thereby, third impurity region 8 can restrict the depletion layer extending from p-type region 7 to n-type drift region 14, and suppress an increase in electric resistance.

Further, according to JBS 1 in accordance with Embodiment 2, n-type region 8 is spaced from each of the plurality of second region portions 6a. Thereby, generation of a strong electric field at a boundary between n-type drift region 14 and p-type region 7 can be suppressed, and thus breakdown voltage can be further improved.

It is noted that, although a JBS has been described as an exemplary wide bandgap semiconductor device in each of the embodiments described above, the wide bandgap semiconductor device may be any semiconductor device having a Schottky electrode, and is not limited to a JBS. Further, although the description has been given in each of the embodiments described above based on the assumption that n type is the first conductivity type and p type is the second conductivity type, p type may be the first conductivity type and n type may be the second conductivity type. In this case, the donor and the acceptor in the above description are also reversed.

Although the embodiments of the present invention have been described, it should be understood that the embodiments disclosed herein are illustrative and non-restrictive in every respect. The scope of the present invention is defined by the scope of the claims, and is intended to include any modifications within the scope and meaning equivalent to the scope of the claims.

What is claimed is:

1. A wide bandgap semiconductor device, comprising:
a wide bandgap semiconductor layer having a first main surface and a second main surface opposite to said first main surface; and
a Schottky electrode in contact with said first main surface of said wide bandgap semiconductor layer, wherein
said wide bandgap semiconductor layer includes a first impurity region which is in contact with said Schottky electrode at said first main surface, is in contact with said second main surface, and has a first conductivity type, and a second impurity region which is in contact with said Schottky electrode at said first main surface, is in contact with said first impurity region, and has a second conductivity type different from said first conductivity type,
said second impurity region has a first region which is in contact with said Schottky electrode at said first main surface, and a second region which is connected with said first region and provided on a side of said first region closer to said second main surface,
when viewed in a cross sectional view, a maximum value of a width of said second region along a direction parallel to said first main surface is larger than a width of a boundary portion between said first region and said Schottky electrode, and
said second region has a first surface portion which faces said first main surface, and a second surface portion which is opposite to said first surface portion and faces said second main surface, and
said first region is provided to extend from a portion of said first surface portion of said second region to said first main surface.

2. The wide bandgap semiconductor device according to claim 1, wherein, when viewed in a plan view, an area of said boundary portion is smaller than an area of said second surface portion of said second region.

3. The wide bandgap semiconductor device according to claim 1, wherein an impurity concentration of said first region is higher than an impurity concentration of said second region.

4. The wide bandgap semiconductor device according to claim 1, wherein, when viewed in a plan view, said first region has an island shape.

5. The wide bandgap semiconductor device according to claim 1, wherein, when viewed in a plan view, said second region has a stripe shape.

6. The wide bandgap semiconductor device according to claim 1, wherein
said first region has a plurality of first region portions, and
when viewed in a plan view, said plurality of first region portions are provided along both a first direction parallel to said first main surface and a second direction parallel to said first main surface and perpendicular to said first direction.

7. The wide bandgap semiconductor device according to claim 1, wherein said wide bandgap semiconductor layer includes silicon carbide.

8. The wide bandgap semiconductor device according to claim 1, wherein
said second region includes a plurality of second region portions, and
said wide bandgap semiconductor layer further includes a third impurity region which is provided between said plurality of second region portions, has said first conductivity type, and has an impurity concentration higher than an impurity concentration of said first impurity region.

9. The wide bandgap semiconductor device according to claim 8, wherein said third impurity region is spaced from each of said plurality of second region portions.

10. A wide bandgap semiconductor device, comprising:
a wide bandgap semiconductor layer having a first main surface and a second main surface opposite to said first main surface; and
a Schottky electrode in contact with said first main surface of said wide bandgap semiconductor layer, wherein
said wide bandgap semiconductor layer includes a first impurity region which is in contact with said Schottky electrode at said first main surface, is in contact with said second main surface, and has a first conductivity type, and a second impurity region which is in contact with said Schottky electrode at said first main surface, is in contact with said first impurity region, and has a second conductivity type different from said first conductivity type,
said second impurity region has a first region which is in contact with said Schottky electrode at said first main surface, and a second region which is connected with said first region and provided on a side of said first region closer to said second main surface, when viewed in a cross sectional view, a maximum value of a width of said second region along a direction parallel to said first main surface is larger than a width of a boundary portion between said first region and said Schottky electrode, said second region includes a plurality of second region portions, and said wide bandgap semiconductor layer further includes a third impurity region which is provided between said plurality of second region portions, has said first conductivity type, and has an impurity concentration higher than an impurity concentration of said first impurity region.

11. The wide bandgap semiconductor device according to claim 10, wherein, when viewed in a plan view, an area of said boundary portion is smaller than an area of said second surface portion of said second region.

12. The wide bandgap semiconductor device according to claim 10, wherein an impurity concentration of said first region is higher than an impurity concentration of said second region.

13. The wide bandgap semiconductor device according to claim 10, wherein, when viewed in a plan view, said first region has an island shape.

14. The wide bandgap semiconductor device according to claim 10, wherein, when viewed in a plan view, said second region has a stripe shape.

15. The wide bandgap semiconductor device according to claim 10, wherein said first region has a plurality of first region portions, and when viewed in a plan view, said plurality of first region portions are provided along both a first direction parallel to said first main surface and a second direction parallel to said first main surface and perpendicular to said first direction.

16. The wide bandgap semiconductor device according to claim 10, wherein said wide bandgap semiconductor layer includes silicon carbide.

17. The wide bandgap semiconductor device according to claim 10, wherein said third impurity region is spaced from each of said plurality of second region portions.

* * * * *